United States Patent [19]

Kurtin et al.

[11] 4,328,573
[45] May 4, 1982

[54] PRECISION PHONOCARTRIDGE INTERFACE

[75] Inventors: Stephen Kurtin, Sherman Oaks; Edward Kelm, Pasadena, both of Calif.

[73] Assignee: NAD International, Grafelfing, Fed. Rep. of Germany

[21] Appl. No.: 148,926

[22] Filed: May 12, 1980

[51] Int. Cl.³ .............................................. G11B 27/36
[52] U.S. Cl. .................................... 369/53; 369/128; 324/60 CD; 333/124; 333/17 M
[58] Field of Search .......................... 369/53, 55, 128; 324/60 CD, 58 R, 57 R, 98; 333/32, 25, 17 M, 28 T, 124; 179/1 C

[56] References Cited

U.S. PATENT DOCUMENTS

| | | | |
|---|---|---|---|
| 2,279,500 | 4/1942 | Severin | 369/55 |
| 2,539,674 | 1/1951 | Rhoads | 369/128 |
| 3,534,180 | 10/1970 | Grout | 369/55 |
| 3,824,459 | 7/1974 | Uchida | 324/60 CD |
| 4,001,676 | 1/1977 | Hile | 324/60 CD |
| 4,065,715 | 12/1977 | Jaffe | 324/60 CD |
| 4,103,225 | 7/1978 | Stephens | 324/60 CD |
| 4,187,460 | 2/1980 | Dauge | 324/60 CD |

*Primary Examiner*—Vincent P. Canney
*Assistant Examiner*—Alan Faber
*Attorney, Agent, or Firm*—Spensley, Horn, Jubas & Lubitz

[57] ABSTRACT

A phonograph cartridge interface which enables any magnetic phonograph cartridge to be operated into its proper termination impedance. One embodiment of the device includes a capacitance test section which is used to determine the unknown capacitance of a tonearm cable. A termination network is then adjusted to provide a proper amount of capacitance in view of the determined capacitance and the value of total termination capacitance specified by the cartridge manufacturer. The network also is adjustable to provide the proper termination resistance in parallel with the capacitance.

In a second embodiment capacitance matching circuitry is included which enables the total termination capacitance provided by the tonearm cable and termination network to be adjusted to a desired value. In this embodiment, actual measurement of the tonearm cable capacitance is not required.

Either embodiment of the invention can be (a) configured as a stand-alone device for use with any phono preamplifier or (b) incorporates as an integral part of a phono preamplifier. An isolation amplifier is included in the stand-along version to eliminate effects of the input capacitance of the phono preamplifier to which the interface is connected.

13 Claims, 4 Drawing Figures

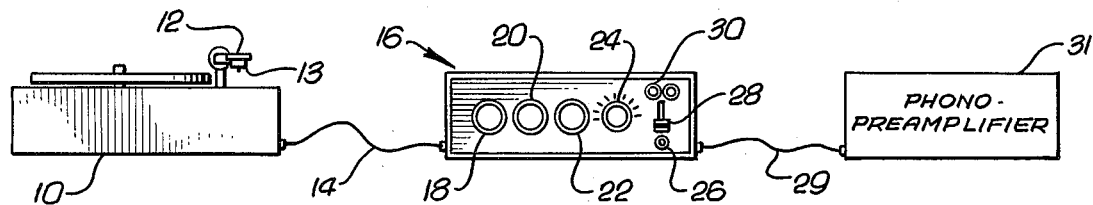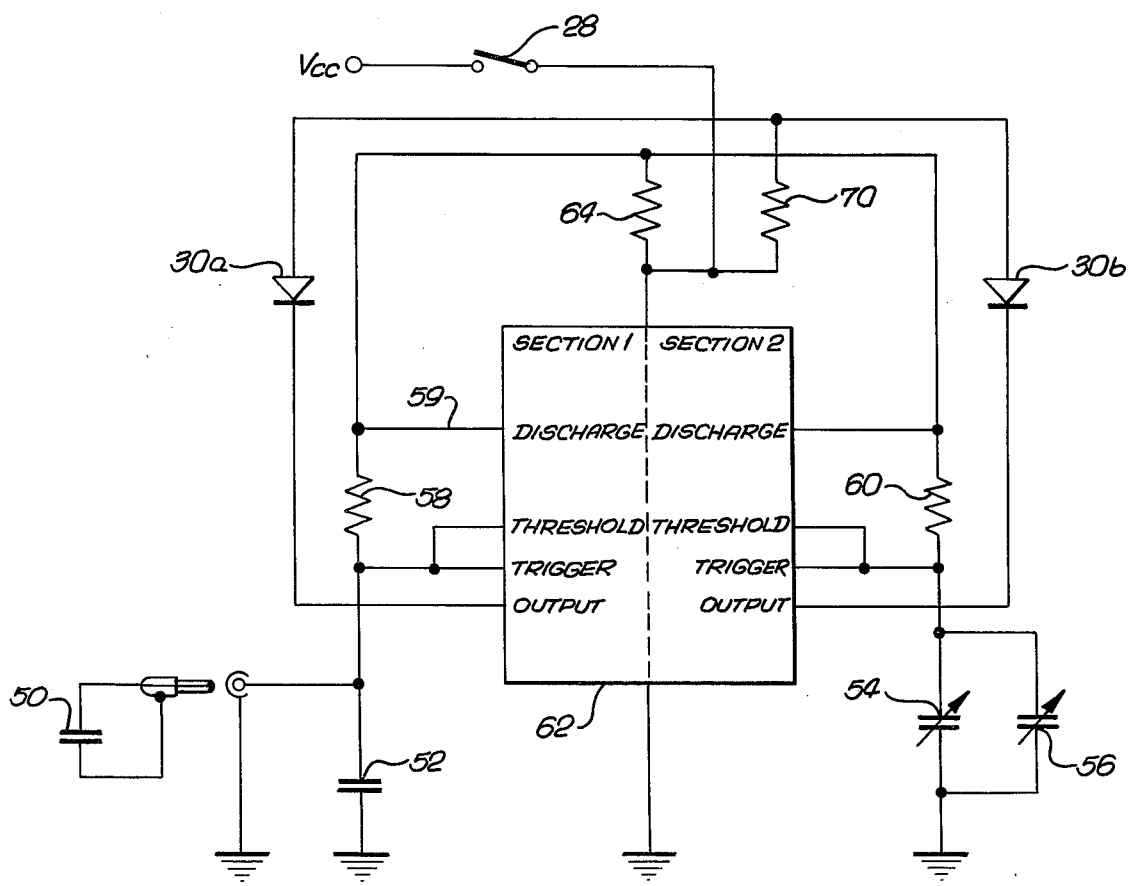

PRECISION PHONOCARTRIDGE INTERFACE

BACKGROUND OF THE INVENTION

1. Field of the Invention

In order to achieve the most accurate reproduction of phonograph records in a high fidelity system, it is important that the magnetic phono cartridge of the system be operated into a specific termination impedance. The fundamental resonance of magnetic phono cartridges is typically located in the uppermost octave of the audible frequency range. Frequency response aberrations resulting from this resonance can be minimized only by operating the cartridge into the proper termination impedance. Failure to properly terminate a cartridge results in frequency response irregularities far larger than those tolerated in other parts of a high fidelity system. The audible consequences of improper cartridge termination can range from rather subtle to very significant, depending on the design of the cartridge and on the extent of mis-termination.

Virtually every manufacturer of magnetic cartridges specifies the ideal termination impedance for each of his products. This impedance consists of a specific resistance in parallel with a specific capacitance. In general, the equivalent capacitance of a given phono preamplifier will be appropriate to only a few cartridges. Additionally, the tone arm cable which is used to connect the cartridge to the phono preamplifier adds its capacitance to the input impedance of the preamplifier. Because of the variations in proper termination impedance among different cartridges, and because of the different input impedances presented by various preamplifier/tone arm cable combinations, it is no surprise that specific cartridges sound best with specific preamps since in the past proper termination has been achieved mainly by happenstance. In fact, the input impedance of some phono preamplifiers is not even equivalent to a pure resistance in parallel with a pure capacitance.

2. Description of the Prior Art

Presently, proper cartridge termination is usually not achieved. In concept one could limit his choice of preamp to those with appropriate input characteristics, measure with laboratory instrumentation the capacitance of the tone arm cable, perform the necessary calculations, and add the appropriate capacitor and resistor in parallel with the preamp input. In practice this procedure is seldom followed because it is tedious and requires the availability of relatively expensive laboratory equipment. Recently, some manufacturers have included one or more switches which control the input resistance and/or capacitance of the phono preamplifier, thus providing some facility to tailor cartridge termination impedance. Such a switch, however, does not eliminate the need to measure, and take into account, the capacitance of the tone arm cable.

It is a primary object of the present invention to provide a means for determining the incremental termination capacitance presented to the cartridge by connecting cables, thereby facilitating proper termination.

It is a further object of the invention to provide a method of properly terminating any magnetic phono cartridge irrespective of the input impedance of the particular phono preamplifier being used.

SUMMARY OF THE INVENTION

The present invention is directed to circuitry which facilitates proper termination of a magnetic phono cartridge. In one version, the circuitry is an integral part of a phonograph preamplifier (or integrated amplifier or receiver) the input impedance of which can be characterized as a pure resistance in parallel with a pure capacitance. In a second version, a stand-alone device is provided which acts as an interface between the cartridge and a phono preamplifier to provide proper termination regardless of the preamplifier used. In each version, a termination network is included which has a variable input impedance, i.e., a variable resistance in parallel with a variable capacitance.

In the stand-alone version of the invention, a high input impedance buffer amplifier is connected to the termination network. The output of the buffer amplifier is in turn connected to the input of a phono preamplifier. The termination impedance seen by the cartridge is thus the capitance of the tonearm cable in parallel with the impedance of the termination network. The input impedance of the phono preamp is isolated from the cartridge by the buffer amplifier and thus does not affect the termination impedance seen by the cartridge. In the version directed to circuitry integral with a phono preamplifier, the total termination capacitance is a function of the tonearm cable, the input section and the input capacitance of the normal phono preamp circuitry (i.e., no buffer amp is used). In this version, therefore, the input capacitance of the phono preamplifier must be taken into account.

One of two embodiments can be employed to facilitate proper termination. In one embodiment, the capacitance of the tonearm cable is measured and the capacitance of the termination network is then set in view of the measured capacitance of the cable. In a second embodiment, the tonearm cable is connected to the termination network and the combination of the cable and termination network is connected to a capacitance "matching" circuit. The termination network capacitance is then varied until the total capacitance of the tonearm cable and termination network is equal to a predetermined set value. Either the measuring or matching technique can be employed in either version of the invention (stand-alone or integral with a preamplifier).

In order to properly terminate a cartridge when the matching embodiment is employed, a calibrated variable capacitor is set to the value of the termination capacitance specified by the manufacturer of the cartridge. The combination of the tonearm cable and a variable capacitor in the termination network is then connected to the matching circuitry. The value of the variable capacitor is adjusted until the combination (variable capacitor and tonearm cable) has a capacitance equal to that of the reference capacitor, which is indicated by means of a pair of LED's in the matching circuitry.

If the preamplifier version of the invention is used, the variable capacitor is calibrated to take the value of the input capacitance of the preamp (which is not included in the matching operation) into account. For example, if the preamp input capacitance is 20 pf and the desired termination capacitance is 370 pf, setting of the dial to 370 pf will cause the reference capacitor to have a value of 350 pf. When the tonearm cable and variable capacitor combination are adjusted to equal this value, the total termination capacitance for the cartridge will be 350 pf (the variable capacitor/tonearm combination)+20 pf (the preamp input capacitance)=370 pf, which is the desired value. Thus proper termination is achieved in a simple manner without having to determine the actual capacitance of the tonearm cable.

The invention thus encompasses both a measurement of capacitance technique and a capacitance matching technique. Although described in the specification with respect to either a stand alone or integrated version, it should be appreciated that either technique could be employed in either version with the important difference between the stand-alone and integral devices being that a buffer amp is provided with the stand-alone device but not with the integral device.

BRIEF DESCRIPTION OF THE DRAWINGS

In the drawings:

FIG. 1 is a plan view of the the present invention shown as a stand-alone device connected between a phonograph turntable and a phonograph preamplifier;

FIG. 2 is a diagram of the capacitance matching section of the present invention;

DESCRIPTION OF THE PREFERRED EMBODIMENTS

Figure 3:
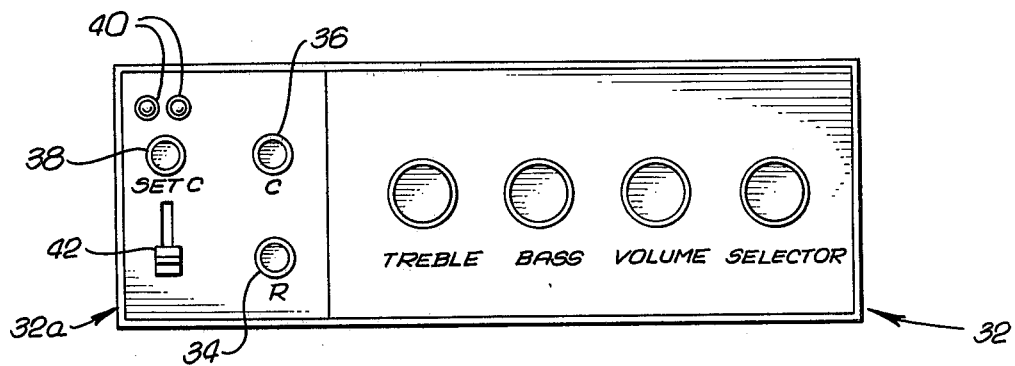
FIG. 3 is a diagram of an embodiment of the invention integral with a phono preamplifier.

Referring to FIG. 1, an phonograph turntable 10 includes a tonearm 12 which carries a magnetic phonograph cartridge 13. Wires within the tonearm 12 exit from the turntable as connecting cable 14, which is in turn connected to a stand-alone precision cartridge interface (PCI) 16 of the present invention. The front panel of the PCI includes an output level control 18, a knob 20 which sets the resistive load seen by the cartridge, a knob 22 which controls the amount of capacitance which the circuitry within the PCI adds to that provided by the cable 14 and a knob 24 which forms a part of the capacitance test (or matching) section to be described subsequently. Also included on the front panel are an input jack 26, a momentary lever switch 28 and a pair of LED's 30, all of which are used in conjunction with the capacitance test section. The output 29 of the PCI is in turn connected to the input of a phono preamplifier 31.

Cable 14 is generally a dual shielded stereo cable having two separate coaxial leads. The capacitance of each channel of the tonearm cable 14 typically ranges from about 20 pf to about 400 pf. In order to determine the capacitance of the tonearm cable 14, the cartridge 13 is disconnected from the tonearm 12 and one lead of the cable 14 is plugged into the jack 26. Lever 28 is then activated, thus causing one of the LED's 30 to light. The knob 24 is rotated until the other LED becomes lit, at which point the setting of the knob 24 can be read to determine the capacitance of the tonearm cable 14 including the wiring within the tonearm. Knob 22 can then be set so that the PCI adds enough capacitance to make up for the difference between the measured tonearm cable capacitance and that required for proper termination of the cartridge 13. Knob 20 is set so as to provide the proper termination resistance for the cartridge 13 according to the cartridge manufacturer's specifications. That is, by using the results of the capacitance test along with the specified termination impedance for the cartridge 13, knobs 20 and 22 can be adjusted so as to provide precise termination for the cartridge 13. Proper termination having been set up, the cartridge 13 is connected to the tonearm 12 and the cable 14 is plugged into the normal input (not shown) of the PCI 16.

The knobs 20 and 22 control the impedance of a cartridge termination network contained in the PCI, which is comprised of a variable resistance in parallel with a variable capacitance. The output of the termination network is connected to a buffer or isolation amplifier in the PCI, which isolates the termination network from the phono preamp 31. The isolation amp prevents the input capacitance of the phono preamp 31 from affecting the termination impedance seen by the cartridge. Both termination networks and isolation amplifiers are well known in the art and the specific circuitry need not be described in detail. The input impedance of the isolation amp is determined by the setting of the cartridge termination network. The isolation amp preferably has a low output impedance, which enables relatively long cables to be used to connect the PCI output to the phono preamp 31 without causing the signal degradation associated with long cables because of their large capacitance. This permits the user to locate the turntable 10 and PCI 16 a long distance from the phono preamp 31.

The capacitance measuring circuit of the PCI works by matching the time constant of a calibrated RC network with that of an unknown RC network which includes the tonearm cable. In the present embodiment of the invention, a single integrated circuit incorporating dual timers, such as Signetics Model NE556, is used to control the charging and discharging of the RC networks. The operation of a time constant matching circuit used with a stand-alone embodiment will be described with reference to FIG. 2. Initially, capacitors 50 (the capacitance of the tonearm cable), 52, 54 and 56 start with a charge of zero volts. When the switch 28 on the front panel of the PCI is closed, the capacitors 50–56 begin charging toward a supply voltage level $V_{cc}$ through a resistor 64 and two equal valued resistors 58 and 60. Since the capacitors 50 and 52 are in parallel, their values will add. Similarly, the values of the capacitors 54 and 56 will add. The capacitors 50 and 52 and the resistor 58 form a first RC network and the capacitors 54 and 56 and the resistor 60 form a second RC network. The network which has the least capacitance will have the smaller time constant and will therefore charge toward $V_{cc}$ more rapidly than the other network. Assuming that the sum of the capacitances 50 and 52 is less than that of the capacitances 54 and 56, the capacitors 50 and 52 will charge more rapidly than will the capacitors 54 and 56. When the voltage on the capacitors 50 and 52 exceeds two-thirds $V_{cc}$, as detected by the threshold input of section 1 of an IC timer 62, resistor 64 will be shorted to ground through line 59 by IC 62, thereby removing the source of charging voltage to both of the resistors 58 and 60. This causes both of the capacitor pairs 50, 52 and 54, 56 to begin discharging toward ground. In addition, the output terminal of section 1 of the IC 62 will go low, thereby causing an LED 30a to be lighted through a resistor 70. Discharge continues until the voltage across the capacitors 50 and 52 is less than one-third of $V_{cc}$ at which time section 1 of the IC 62 will cause the short condition to be removed from the line 59, allowing charging to begin again and extinguishing the LED 30a.

Thus the circuit of FIG. 2 will oscillate at a frequency determined by the capacitors 50 and 52 and the resistor 58. Since the oscillation is in the kilohertz range, the activated LED 30a appears to be continuously lit as viewed by the human eye. Because of the larger capacity of the capacitors 54 and 56, the output of section 2 of the IC 62 will never go low and the LED 30b will therefore never be lit. If the capacitors 50 and 52 were larger than the capacitors 54 and 56, the reverse condition would prevail, i.e., LED 30b would be lit and LED 30a would be extinguished. Transition from activation of the LED 30a to activation of the LED 30b occurs when the sum of the capacitors 50 and 52 is equal to the sum of the capacitors 54 and 56 (assuming resistors 58 and 60 are of equal value). A single current limiting resistor 70 is provided, since only one of the LED's will be lit at a time.

In operation, the value of the capacitor 54, which is a calibrated variable capacitor, is varied until the point is found at which transition occurs from illumination of the LED 30a to the LED 30b, or vice versa. As discussed above, this transition occurs when the sum of the capacitors 50 and 52 is equal to the sum of the capacitors 54 and 56. At the transition (or "balance") the value of the capacitor 50 may be read off of a suitably calibrated scale attached to the capacitor 54. The value the capacitor 54 is controlled by means of the knob 24 on the front panel of the PCI.

The capacitor 56 is a "zero adjustment" which is set at the factory. With the unknown capacitance 50 removed and with the capacitor 54 set to its minimum value, the capacitor 56 is adjusted to achieve balance, at which point C54 min +C56=C52. The capacitor 52 has a value on the order of 30 pf, and serves to prevent oscillation of the capacitance test circuitry at a frequency higher than the maximum specified for reliable operation of the IC timer 62. In the absence of the capacitor 52, such oscillation could occur were the capacitance test circuit to be operated without a suitable unknown capacitance connected.

Thus, it can be seen that the IC 62 controls the cyclic charging and discharging of the two RC networks of the circuit of FIG. 2. Each section of the IC timer forms a separate oscillator with its respective RC network. The faster oscillator (as determined by the RC time constants) prevents the slower one from oscillating. Although the specific circuit described utilizes a Signetics Model NE556 dual timer, other standard dual timers (or two single timers) could be utilized to form the oscillators. By varying the value of the capacitor 54, the second RC network can be adjusted to achieve a time constant which is substantially equal to the first RC network. At this point, the value of the unknown capacitance 50 may be read off of a suitably calibrated scale attached to the shaft of the capacitor 54. Thereby, the present invention provides a system including test circuitry which enables the capacitance of a tonearm cable to be determined and additional circuitry which provides user selected control of the termination impedance of a phonograph cartridge. Thus, with a single device the user can both determine the unknown capacitance of the tonearm cable and then provide a termination impedance which takes the unknown capacitance into account.

Figure 4:
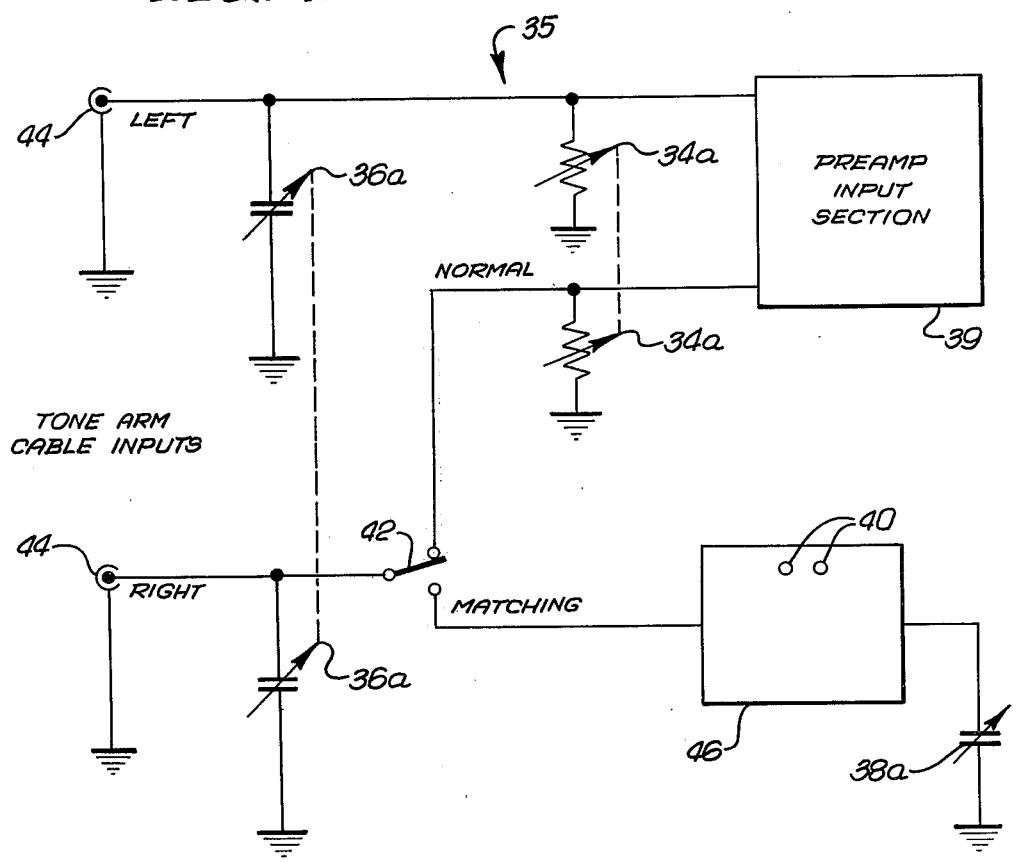
FIG. 4 is a diagram of the input connection used in the preamplifier of FIG. 3.

Referring now to FIGS. 3 and 4, an embodiment of the invention which is incorporated as an integral part of a preamplifier (or receiver or integrated amplifier) will be described. The front panel of a preamplifier 32 includes a cartridge termination section 32a. The section 32a controls a termination network similar to that used in the stand-alone device and includes a knob 34 to control the termination resistance and a knob 36 to control termination capacitance. The section 32a also includes a calibrated capacitance set knob 38 which is used in conjunction with a pair of LED's 40 and a lever switch 42. To provide the proper termination for a particular cartridge, the knob 34 is set to the resistance which is specified by the manufacturer of the cartridge in use. The knob 38 is set to the termination capacitance specified by the cartridge manufacturer. With the tonearm cable of the turntable connected to the preamp 32 but the cartridge disconnected, the lever 42 is activated, at which point one of the two LED's 40 will be lit. The capacitance control knob 36 is then carefully adjusted to the transition point at which the lit LED is just extinguished and the other LED becomes lit. At that transition point (balance) the total termination capacitance provided by the tonearm cable, the termination network and the phono preamp input is equal to the setting of the knob 38.

FIG. 4 is a schematic of the circuitry used to achieve proper termination with the preamp 32 of FIG. 3. During listening, the switch 42 is in the "normal" position. The termination section 32a controls a termination network 35 which includes variable resistor 34a in parallel with variable capacitor 36a (controlled by knobs 34 and 36 respectively). The tonearm cable 14 is connected to input jacks 44 and the termination network 35 is connected to the input section 39 of the phono preamp. The total termination impedance for a cartridge is a function of the impedance of the preamp input section 39, the termination network 35 and the tonearm cable 14. The input capacitance of the input section 39 is a known value, e.g., 20 pf. If the specified termination capacitance of the cartridge is, e.g., 370 pf the tonearm cable 16 and termination network 35 must provide an additional 350 pf. In the order to set the capacitance control knob 36 to accomplish this, the knob 38 is set to 370 pf. In this setting, the capacitance of a capacitor 38a will be equal to 350 pf, thus compensating for the input capacitance of the section 39. The switch 42 is then switched to a "matching" position, which connects one channel of the termination capacitor 36a and tonearm cable 16 to a capacitance matching circuit 46 similar to the circuitry of FIG. 2. The function of the matching section 46 is identical to that of the circuit of FIG. 2, with the tonearm cable and capacitor 36 representing the "unknown" capacitance (analogous to the capacitor 50) and the capacitor 38a representing a known or reference capacitor (analogous to the capacitor 54). At this point, one of the LED's 40 will be lit. The knob 36 is then rotated until transition in the lighting of the LED's 40 occurs. At such point, the value of the capacitance of the tonearm cable and capacitor 36a is substantially equal to the capacitance of the capacitor 38a, e.g., 350 pf. The total termination capacitance is thus 350 pf+20 pf (preamp input section 39)=370 pf, which is the value set on the knob 38. The integrated embodiment of the invention thus is simpler to operate than the stand-alone embodiment, as the user is not required to perform any arithmetic.

In summary, the present invention provides a system, in either stand-alone or integrated form, which enables proper cartridge termination to be achieved. In one embodiment, tonearm cable capacitance is actually measured, whereas in another, no actual measurement is made. Instead, the system matches the capacitance of the tonearm cable and termination network combination to a desired capacitance. Although the invention has been described in terms of two specific embodiments, it should be appreciated that modifications and variations will occur to those skilled in the art. For example, the stand-alone embodiments could easily be incorporated into the base of a turntable, thus providing a turntable system which facilitates proper termination for any cartridge. In addition, although a system using a capacitance matching technique has been described with respect to the integrated version and a capacitance measuring technique has been described with respect to the stand-alone version, either technique can be employed in either version. The basic difference between the stand-alone version and integral version is that the stand-alone version requires a buffer amplifier, which enables it to work with any phono preamplifier. Since the integrated version is designed to work with a particular preamplifier having a known input impedance (and since, of course, no long cables will be used between the phono preamplifier and the termination network) no buffer amp is required. In view of the many possible modifications, the scope of the invention should be determined not from the foregoing description but rather by reference to the appended claims.

We claim:

1. An interface device for connection between a magnetic phonograph cartridge carried in a tonearm and a phonograph preamplifier, comprising:
   a capacitance test section for determining the capacitance of a tonearm cable of the tonearm;
   a termination network for connection to a tonearm cable, said termination network including variable capacitance means, whereby correct termination capacitance for the phonograph cartridge is achieved by proper adjustment of the capacitance means after determination of the tonearm cable capacitance; and
   an isolation amplifier connected to the termination network, said isolation amplifier for preventing the input impedance of a phonograph preamplifier from affecting the termination impedance of the phonograph cartridge, the output of the isolation amplifier being the output of said interface device.

2. The device of claim 1 wherein the termination network includes variable resistance means, connected in parallel with the variable capacitance means, for adjusting the termination impedance of the cartridge.

3. A circuit for determining the value of an unknown capacitor such as a tonearm cable, comprising:
   a first resistor, wherein during testing said unknown capacitor is connected to the first resistor so as to form a first RC network;
   a variable reference capacitor;
   a second resistor connected to the variable reference capacitor to form a second RC network;
   means for charging both the reference capacitor and the unknown capacitor;
   control means for cyclically discharging both of said capacitors when the voltage on either of them exceeds a first predetermined level and causing recharging when the voltage on either of the capacitors falls below a second predetermined level; and
   indicator means for indicating which of said capacitors charges to the first predetermined level before discharging begins, whereby to determine the capacitance of the unknown capacitor the value of the reference capacitor is varied until the indicator means indicates a transition wherein the capacitor which was originally charging more slowly is now charging more quickly and thereby reaching said first predetermined voltage before discharging begins, said transition occurring when said capacitances are substantially equal.

4. The circuit of claim 3 wherein the control means includes a pair of integrated circuit timers.

5. The circuit of claim 3 wherein the indicator means comprises a pair of light emitting diodes, wherein a first of said diodes will light if the reference capacitor charges to the first predetermined level and a second of said diodes will light if the unknown capacitor charges to the first predetermined level.

6. The circuit of claim 3 wherein said reference capacitor comprises a pair of variable capacitors connected in parallel and further including a known value capacitor connected to the first resistor, wherein the known value capacitor forms part of the first RC network.

7. A phonograph preamplifier comprising:
   an input section having a predetermined input capacitance;
   a termination network having a variable capacitance, said termination network being connected to said input section and having an input, wherein in operation a tonearm cable of a phonograph is connected to the input; and
   capacitance meatching means, selectively connected to the termination network, for enabling the overall capacitance of the termination network and the tonearm cable to be set to a desired value, thereby facilitating proper termination of a magnetic phonograph cartridge.

8. The preamplifier of claim 7 wherein said capacitance matching means includes a calibrated variable setting capacitor and a matching circuit to which the setting capacitor and termination network are connected, said matching circuit determining and indicating when the capacitance of the setting capacitor is equal to the sum of the capacitance of the termination network and tonearm cable.

9. The preamplifier of claim 8 wherein said setting capacitor is calibrated to compensate for the capacitance of the input section so that when the setting capacitor is set to a particular set value, its actual capacitance is equal to the set value minus the capacitance of the input section, whereby when the matching circuit indicates that the capacitance of the termination network and the tonearm cable are equal to the capacitance of the setting capacitor, the total termination capacitance provided by the tonearm cable, termination network and input section is equal to the set value.

10. The preamplifier of claim 7 wherein the termination network includes variable resistance means, in parallel with the variable capacitance, for adjusting the termination resistance of the termination network.

11. An interface circuit for connection between a magnetic phonograph cartridge and a phonograph preamplifier comprising:
   a termination network having a variable capacitance, said termination network having an input, wherein in operation a tonearm cable of a phonograph is connected to the input;
   capacitance matching means, selectively connected to the termination network, for enabling the capacitance of the termination network and the tonearm cable to be set to a desired value, thereby facilitating proper termination of the phonograph cartridge; and an isolation amplifier connected to the termination network, wherein in operation the output of the isolation amplifier is connected to a phonograph preamplifier, said isolation amplifier preventing the phonograph preamplifier from affecting the termination impedance seen by the phonograph cartridge connected to the interface circuit.

12. The circuit of claim 11 wherein said capacitance matching means includes a calibrated variable setting capacitor and a matching circuit to which the setting capacitor and termination network are connected, said matching circuit determining and indicating when the capacitance of the setting capacitor is equal to the sum of the capacitance of the termination network and tonearm cable.

13. A phonograph preamplifier comprising:

an input section having a predetermined input capacitance;

a termination network having a variable capacitance, said termination network being connected to said input section and having an input, wherein during operation a tonearm cable of a phonograph is connected to the input; and capacitance test means, selectively connected to the termination network, for enabling the capacitance of the tonearm cable to be determined, thereby facilitating proper termination of a magnetic phonograph cartridge.

* * * * *